US005202571A

United States Patent [19]

Hirabayashi et al.

[11] Patent Number: 5,202,571

[45] Date of Patent: Apr. 13, 1993

[54] ELECTRON EMITTING DEVICE WITH DIAMOND

[75] Inventors: Keiji Hirabayashi; Noriko Kurihara, both of Tokyo; Takeo Tsukamoto, Atsugi; Nobuo Watanabe, Gotenba; Masahiko Okunuki, Tokyo, all of Japan

[73] Assignee: Canon Kabushiki Kaisha, Tokyo, Japan

[21] Appl. No.: 725,476

[22] Filed: Jul. 3, 1991

[30] Foreign Application Priority Data

Jul. 6, 1990 [JP] Japan ........ 2-177443

Jul. 6, 1990 [JP] Japan ........ 2-177444

[51] Int. Cl.5 ........ H01L 29/161

[52] U.S. Cl. ........ 257/10; 257/200; 257/485; 257/77; 257/508; 313/346 R; 313/446; 313/499; 437/176; 437/177; 423/446

[58] Field of Search ........ 357/15, 68, 16, 67, 357/15 A, 15 M, 15 P, 15 R, 52, 52 C, 52 T, 52 R, 52 E, 13, 55; 313/346 R, 446, 499, 366, 351, 631, 632, 633; 437/173, 175, 187, 180, 176, 177; 423/446; 156/DIG. 68

[56] References Cited

U.S. PATENT DOCUMENTS

| | | | |
|---|---|---|---|
| 4,259,678 | 3/1981 | Van Gorkam et al. | 357/113 |
| 4,303,930 | 12/1981 | Van Gorkam et al. | 357/113 |
| 4,833,507 | 5/1989 | Shimizu et al. | 357/52 X |
| 4,982,243 | 1/1991 | Nakahata et al. | 357/15 |
| 5,002,899 | 3/1991 | Geis et al. | 357/15 X |
| 5,031,015 | 7/1991 | Miyawaki | 357/52 X |

FOREIGN PATENT DOCUMENTS

| | | |
|---|---|---|
| 54-30274 | 9/1979 | Japan . |
| 60-25858 | 3/1980 | Japan . |

*Primary Examiner*—William Mintel
*Attorney, Agent, or Firm*—Fitzpatrick, Cella, Harper & Scinto

[57] ABSTRACT

An electron emitting device is provided with a p-semiconductor layer formed on a semiconductor substrate. The p-semiconductor layer is composed of a diamond layer.

31 Claims, 8 Drawing Sheets

ELECTRON EMITTING DEVICE WITH DIAMOND

BACKGROUND OF THE INVENTION

1. Field of the Invention

The present invention relates to an electron emitting device for use in a display apparatus, an electron beam drawing apparatus, a vacuum tube, an electron beam printer or the like, and more particularly to a semiconductor electron emitting device for inducing an avalanche amplification thereby emitting hot electrons to the outside, and an electron emitting device having a surface with negative electron affinity.

2. Related Background Art

Among the semiconductor electron emitting devices utilizing avalanche amplification, there is a known device having a junction of a p-type semiconductor and an n-type semiconductor on a semiconductor substrate (p-n junction device), and a device having a Schottky junction of a semiconductor layer and a metal or a metal compound (Shottky junction device).

The semiconductor electron emitting device of pn junction type utilizing avalanche amplification is for example disclosed in the U.S. Pat. Nos. 4,259,678 and 4,303,930.

In said semiconductor electron emitting device, a p-semiconductor layer and a n-semiconductor layer are formed on a semiconductor substrate, and a metal such as cesium is attached on the surface of said n-semiconductor layer to form an electron emitting part. An electron avalanche is induced by applying an inverse bias voltage to a diode formed by said p-and n-semiconductor layers to generate hot electrons, thereby emitting the electrons from said electron emitting part.

Also in said semiconductor emitting devices of Shottky junction type utilizing avalanche amplification, there is a known device inducing an avalanche amplification by applying an inverse bias voltage to a junction of a p-semiconductor layer and a metal electrode to generate hot electrons, thereby emitting the electrons from an electron emitting part.

However, in order to obtain a high electron emission current from such semiconductor electron emitting device utilizing avalanche amplification, it is generally required to supply a very high current to the device. In general there is required a current density of 10,000 Å or higher in order to induce electron emission from the pn junction as explained above.

Such large current supply to the conventional semiconductor electron emitting device generates heat therein, giving rise to drawbacks such as unstable electron emitting characteristics or shortened service life of the device.

Consequently it is desirable to have an electron emitting device with reduced local heat generation.

Also in the conventional structures of the pn junction type explained above, a material of low work function is employed for reducing the work function of the electron emitting part, thereby lowering the inverse bias voltage.

A material of low work function, such as cesium, is conventionally employed for realizing electron emission without an excessively high inverse bias voltage, but such material, being chemically active and subject to the influence of local heat generation in the semiconductor layer, is unable to ensure stable operation. For this reason it is desirable to have an electron emitting device allowing the use of a relatively stable material for the purpose of reducing the work function.

Also for the electrode of the conventional electron emitting device of Shottky junction type, it is desirable to have a material capable of forming a Shottky junction that provides a low work function. However, in the conventional electron emitting devices, the freedom of selection of the electrode material has been limited because of a tendency of migration of the electrode material by local heat generation in the semiconductor layer and because of a large energy band gap of the semiconductor, so that the material selection for improving the device stability cannot be achieved in satisfactory manner. Also drawbacks result as in the conventional pn-junction type explained above if a cesium or cesium oxide layer is formed on the electron emitting part in order to reduce work function thereof.

For this reason it is desirable to have an electron emitting device enabling a wider selection of the electrode material for the Shottky electrode, with a low local heat generation.

On the other hand, semiconductor electron emitting devices utilizing a negative electron affinity (NEA) are disclosed for example in the Japanese Patent Publication Nos. 54-30274 and 60-25858.

In such electron emitting device, a n-semiconductor layer and a p-semiconductor layer are formed on a semiconductor substrate and a layer of a material of low work function such as cesium is formed on the surface of said p-semiconductor layer to reduce the work function at the surface, thereby forming an electron emitting part of a negative electron affinity state. In such device, a forward bias voltage is applied to a diode formed by said n- and p-semiconductor layers, thereby supplying the p-semiconductor layer with electrons and emitting electrons from the electron emitting part.

As explained above, the conventional forward-bias electron emitting device utilizing negative electron affinity requires, for inducing electron emission with a forward bias, a layer of a material of low work function, thereby forming a surface with a negative electron affinity.

Said low work function material has been composed for, example, of cesium in consideration of the energy band gap of the semiconductor material.

Also in such conventional semiconductor electron emitting device employing a work function reducing material, since the electrons in the n-semiconductor layer can reach the electron emitting part through the p-semiconductor layer under a forward biasing, it is necessary, for improving the electron emitting efficiency, to reduce the number of holes in the p-semiconductor layer and to reduce the thickness of said p-semiconductor layer in order to protect the electrons injected into said p-semiconductor layer from recombination with holes therein or from phonon scattering, but there are the following encountered drawbacks in such case.

More specifically, an increased resistance of the p-semiconductor layer leads to local heat generation therein. In order to obtain a high electron emission current from the semiconductor electron emitting device, it is generally required to supply a very high current to said device, and such current supply induces heat generation in the device. Such heat generation tends to cause evaporation or migration of the material of low work function which is generally not stable, such as cesium, thereby causing unevenness in the electron emitting area, unstable electron emitting characteristics and shortened service life of the device.

Furthermore, since cesium is chemically extremely active, stable operation can only be expected at a pressure of $10^{-7}$ Torr or lower, and the service life and the efficiency of the device are dependent on the level of vacuum.

For this reason it is desirable to have an electron emitting device with a surface of negative electron affinity state without relying on a work function reducing material, or a device allowing the use of a relative stable work function reducing material, instead of cesium or cesium oxide.

SUMMARY OF THE INVENTION

In consideration of the foregoing, an object of the present invention is to provide an electron emitting device with reduced local heat generation.

Another object of the present invention is to provide an electron emitting device allowing the use of a relatively stable material for reducing the work function.

Still another object of the present invention is to provide an electron emitting device providing a wide selection of the material for Shottky electrode, thereby enabling satisfactory selection of the materials for improving the device stability.

Still another object of the present invention is to provide an electron emitting device having a surface of negative electron affinity even without a layer of a material for reducing the work function.

The foregoing objects can be attained, according the present invention, by a semiconductor electron emitting device of a first type, provided with a p-semiconductor layer formed on a semiconductor substrate and an electron avalanche inducing layer formed to constitute a junction with said p-semiconductor layer and capable of inducing an electron avalanche breakdown in cooperation with said p-semiconductor layer, wherein electron emission is induced by an reverse bias voltage applied between said p-semiconductor layer and said electron avalanche inducing layer, said device being characterized by a fact that the p-semiconductor layer is composed of a diamond layer.

In an embodiment of the semiconductor electron emitting device of said first type of the present invention, said electron avalanche inducing layer is composed of a n-semiconductor layer, and in another embodiment, said electron avalanche inducing layer is composed of a Shottky electrode.

In still another embodiment of said first type, there is provided, on said electron avalanche inducing layer, a layer of a metal or a metal compound of a work function not exceeding the energy band gap of diamond.

In still another embodiment of said first type, said n-semiconductor layer is composed of diamond, and in still another embodiment, said n-semiconductor layer is composed of a material of low resistance, different from diamond, thereby forming a heterojunction with said p-semiconductor layer.

Said semiconductor electron emitting device of the first type of the present invention exhibits extremely good thermal conductivity due to the use of a diamond layer in the p-semiconductor layer, thereby achieving satisfactory heat diffusion and dissipation even if heat is generated during operation, whereby stabilized electron emitting characteristics and extended device service life can be attained.

The present invention also provides a semiconductor electron emitting device of a second type provided with a n-semiconductor layer formed on a semiconductor substrate and a p-semiconductor layer so formed as to constitute a junction with said n-semiconductor layer, and having a surface of negative electron affinity, wherein the electron emission is conducted from said p-semiconductor layer by application of a forward bias voltage between said p- and n-semiconductor layers, said device being characterized by the fact that said p-semiconductor layer is composed of a diamond layer.

In an embodiment of the semiconductor electron emitting device of the second type, there is provided, on said p-semiconductor layer, with a layer of a metal or a metal compound of work function not exceeding the energy band gap of diamond.

In another embodiment of said second type, said n-semiconductor layer is composed of a material of low resistance, different from diamond, thereby forming heterojunction with said p-semiconductor layer.

The above-explained semiconductor electron emitting device of the second type of the present invention is capable of electron emission without a surface layer of a material of low work function, because the p-semiconductor layer is composed of diamond which itself has a small work function.

Also, the device of said second type exhibits an extremely good thermal conductivity, thus achieving satisfactory heat dissipation even if heat is generated in the device, because of the use of a diamond layer. Therefore, even if a layer of a material of low work function is employed, said material is little affected by the heat, so that stable electron emission and extended service life can be attained.

DETAILED DESCRIPTION OF THE PREFERRED EMBODIMENTS

Figure 3A:
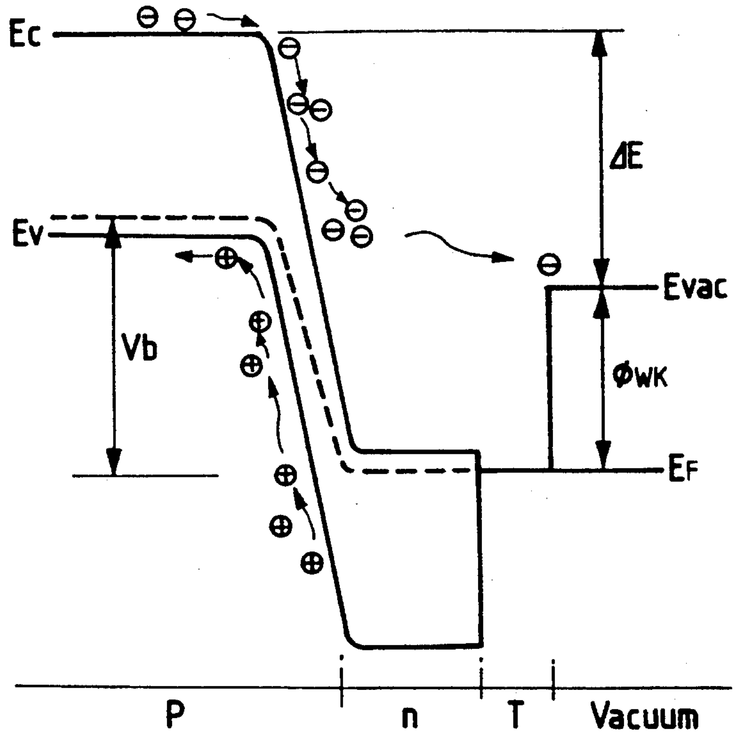
FIG. 3A is an energy band chart of a pn-junction electron emitting device utilizing a p-diamond layer and an n-diamond layer, belonging to the electron emitting semiconductor devices of a first type of the present invention.

In the following there will be an explanation of the function of an electron emitting semiconductor device of a first type of the present invention, with reference to FIGS. 3A and 3B, which are energy band charts of an electron emitting semiconductor device of pn junction type wherein the electron avalanche inducing layer is composed of a n-semiconductor layer. In these charts, p indicates a p-semiconductor layer, n indicates a n-semiconductor layer, and T indicates a layer of a material of low work function. FIG. 3A indicates a case of pn junction of a p-type diamond layer and a n-type diamond layer.

In the present invention, the p- or n-semiconductor also includes so-called $p^+$- or $n^+$-type with a high impurity concentration, unless particularly specified otherwise.

Figure 3B:
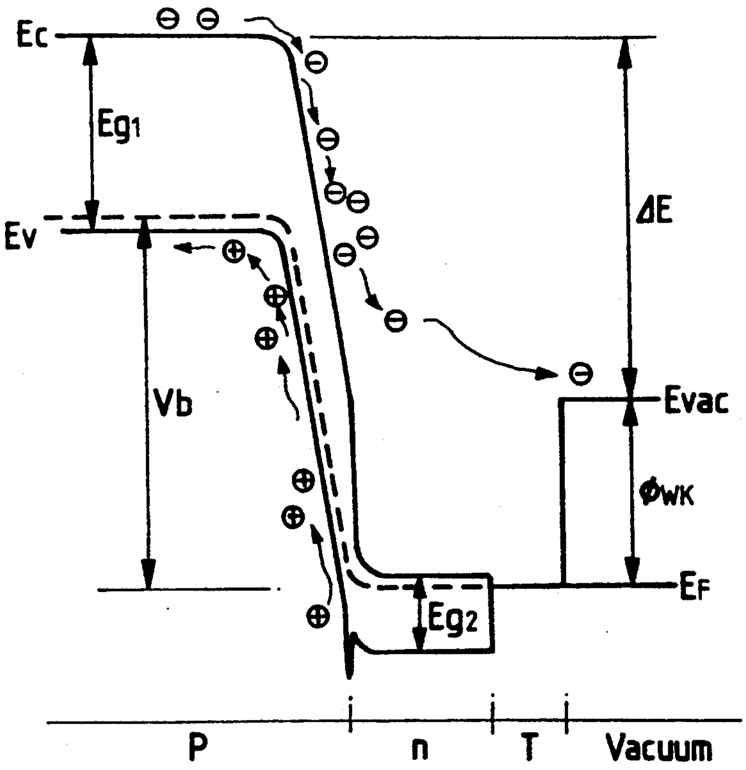
FIG. 3B is an energy band chart of a hetero-pn-junction electron emitting device.

As shown in FIGS. 3A and 3B, an inverse biasing on the junction between the p- and n-semiconductor layers allows to position a vacuum level $E_{vac}$ lower than the conduction band $E_c$ of the p-semiconductor layer, thereby obtaining a large energy difference $\Delta E$ $(=E_c-E_{vac})$.

An avalanche amplification in this state allows generation of a large number of electrons which are minority carriers in the p-semiconductor layer, thereby increasing the emission efficiency of electrons. Also the electric field in the depletion layer provides the electrons with energy to generate hot electrons, whereby the electrons with a potential energy higher than the work function of the surface of the n-semiconductor layer can be emitted from the surface without energy loss by scattering.

In the electron emitting semiconductor device of said first type, the use of a diamond layer at least in the p-semiconductor layer provides excellent thermal conductivity, whereby the local heat generation of the device can be well dissipated and the electron emitting characteristics can be stabilized.

A pn junction of diamond semiconductors as shown in FIG. 3A provides a smooth bonding of energy bands at the junction interface, thereby realizing satisfactory electron emitting characteristics with limited electron scattering.

FIG. 3B shows an energy band chart in case of a hetero junction of a p-type diamond layer and a n-semiconductor layer of a band gap smaller than that of diamond. In the electron emitting device of pn junction type utilizing avalanche amplification, the heat generation can be further reduced by a lower resistance in the n-semiconductor.

In a material of a large band gap such as diamond, it is generally difficult to reduce the resistivity of the semiconductor to a level of $10^{-4}$ Ωcm as in Si or Ge, because of a small effective density of the conduction band. Thus a reduction in the resistance of the n-semiconductor layer, achieved by the formation, on the p-semiconductor layer, of a n-semiconductor layer of a smaller band gap than in said p-semiconductor layer, allows the further reduction in the heat generation, thereby providing an electron emitting device with stable performance.

Also the use of a diamond layer of a large band gap as the p-semiconductor layer makes it possible to obtain a large $\Delta E$ with a limited inverse bias potential. Consequently the surface of the n-semiconductor layer need not be composed of a layer of the material of low work function which is chemically unstable, such as cesium, but can be composed of a chemically stable material with a relatively high work function. As the energy band gap of diamond is 5.4 eV while the activation energy of a p-semiconductor doped with boron is 0.37 eV, a condition $\Delta E>0$ is satisfied and electron emission is enabled with the application of a relatively low reverse bias voltage if the work function of the material layer formed on the surface of the n-semiconductor layer is 5.0 eV or lower.

Figure 6:
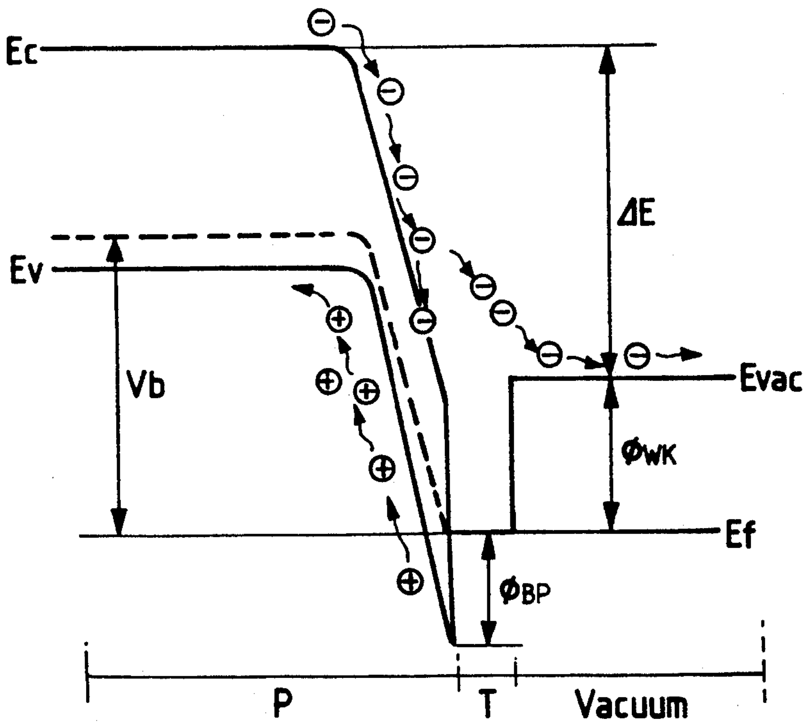
FIG. 6 is an energy band chart of Schottky junction electron emitting device belonging to the electron emitting semiconductor device of the first type of the present invention.

FIG. 6 is an energy band chart of a Schottky junction electron emitting device, in which the electron avalanche inducing layer is composed of a Shottky electrode, among the electron emitting devices of said first type. In FIG. 6, p indicates a p-semiconductor layer, and T indicates a Schottky electrode.

As shown in FIG. 6, an reverse biasing on the junction between the p-semiconductor layer and the thin Shottky electrode film allows to position the vacuum level $E_{vac}$ lower than the conduction band level $E_c$ of the p-semiconductor layer, thereby obtaining a large energy difference $\Delta E$ $(=E_c-E_{vac})$.

An avalanche amplification in this state allows generation of a large number of electrons which are minority carriers in the p-semiconductor layer, thereby increasing the emission efficiency of electrons. Also the electric field in the depletion layer provides the electrons with energy to generate hot electrons with kinetic energy larger than the temperature of the lattice system, whereby the electrons with a potential energy higher than the work function of the surface of the n-semiconductor layer can be emitted from the surface without energy loss by scattering.

The use of diamond, having a large band gap, in the p-semiconductor layer allows selection of the electrode material within a wide range of work function, thereby obtaining a satisfactory Schottky junction. Also the he possibility of selecting the electrode material within a wide range of work function allows the forming of a Schottky junction capable of stable electron emission.

The diamond layer formation in the electron emitting device of the first type can be achieved by known gaseous synthesis methods such as heating filament CVD, microwave plasma CVD, magnetic field coupled microwave plasma CVD, DC plasma CVD, RF plasma CVD or combustion flame method.

The raw material for carbon can be hydrocarbon gas such as methane, ethane, ethylene or acetylene; organic liquid such as alcohol or acetone; or carbon monoxide gas, which may be suitably added with hydrogen, oxygen and/or water.

The impurity for obtaining p-diamond layer can be an element of the group III of the periodic table, such as boron. Boron doping can be achieved by addition of a boron-containing compound to the raw material gas or by ion implantation.

In the pn junction device of the first type of the present invention, the n-semiconductor layer is preferably as thin as possible. When the n-semiconductor layer is composed of a diamond layer, diamond can be doped with an element of the group V of the periodic table, such as nitrogen or phosphor, or lithium. Said doping may be achieved by addition of gas containing such impurity to the raw material gas, or by ion implantation. When the n-semiconductor layer is composed of a semiconductor other than diamond, there may be employed Si, Ge, or an element of the group II, III, V or VI of the periodic table such as In, As or P, or amorphous silicon or amorphous carbide. These materials may be doped with an impurity with a concentration of $1\times10^{20}$ atom/cm$^3$ or higher, thereby reducing the specific resistivity of the n-semiconductor layer to the level of $10^{-4}$ Ω.cm.

The material of the Schottky electrode to be employed in the electron-emitting semiconductor device of the first type in the present invention is required to are show distinct Shottky characteristics to the p-diamond layer. In general a linear relationship stands between the work function $\phi_{wk}$ and the Schottky barrier height $\phi_{Bn}$ to the n-semiconductor (Physics of Semiconductor Devices, Sze 274p, 76(b) Page 17; JOHN WILEY & SONS), so that $\phi_{Bn}$ decreases as the work function becomes smaller. Also the Schottky barrier height $\phi_{Bp}$ to a p-semiconductor is correlated with a relationship $\phi_{Bp}+\phi_{Bn}=E_g/q$ indicates charge, so that said Shottky barrier height can be represented as $\phi_{Bp}=E_g/q-\phi_{Bn}$. Thus the use of a material with a small work function allows formulation of a satisfactory Shottky diode to the p-semiconductor layer.

In the Schottky junction device of said first type of the present invention, the material constituting the Schottky electrode is required to be resistant to migration even under a high temperature. Also efficient electron emission can be achieved by the use of a material of which work function does not exceed the energy band gap of diamond (5.4 eV) minus the activation energy in case of impurity doping. The usable materials in case boron is used as the impurity are elements with a work function not exceeding 5.0 eV in the groups 1A–7A and 2B–4B of the periodic table; certain elements of the groups 8 and 1B of the periodic table such as Ir, Pt and Au; elements of lanthanoid; and a part of various metal silicides, metal borides and metal carbides. Also there may be employed combinations of these elements and materials.

Among these Schottky electrode materials, the high-melting metals such as tungsten, tantalum and molybdenum, and various metal silicides, metal borides and metal carbides are chemically stabler than the materials of low work function employed on the surface of the conventional electron-emitting semiconductor devices, such as cesium. Also Pd, Pt, Au, Ir, Ag, Cu, Rh etc. are advantageously used because of low resistance and resistance to migration, and are capable of stable electron emission even in relative weak vacuum of the order of $10^{-3}$ Torr.

All these materials, having work functions in a range of 1.5–5.0 eV, can form satisfactory Schottky electrodes to the p-semiconductor layer. These Shottky electrode materials can be deposited on the semiconductor with extremely good controllability for example with electron beam evaporation, and a film of a thickness of 1000 Å or lower, preferably 500 Å or less, enables stable electron emission, allowing the hot electrons generated in the vicinity of the Schottky junction to pass through the Shottky electrode without significant energy loss.

The use of the above-explained Schottky electrode obtains a satisfactory electron emitting semiconductor device of the Schottky junction type.

Also in the electron emitting device of the first type of the present invention, the work function reducing material provided on the electron avalanche inducing layer is preferably provided with a work function not exceeding the energy band gap (5.4 eV) of diamond minus the activation energy in case of impurity doping. The usable materials in case of boron doping are elements with a work function not exceeding 5.0 eV in the groups 1A–7A and 2B–4B of the periodic table, certain elements of the groups 8 and 1B of the periodic table such as Ir, Pt and Au, and various metal silicides, metal borides and metal carbides. There can also be combinations employed of these elements and materials.

Among these work function reducing materials, certain elements such as Au, Ir, Pd, Pt, Ag, Cu and Rh are particularly preferred because of low resistance and resistance to migration. These materials are chemically stabler than the work function reducing materials employed in the surface of the conventional electron emitting semiconductor devices, such as cesium, and are capable of stable electron emission even under a relatively weak vacuum of ca. $10^{-3}$ Torr.

These materials can be deposited onto the semiconductor with extremely good controllability for example with electron beam evaporation, and a deposition film of 100 Å or less, preferably of a single atomic layer or several atomic layers allows the hot electrons to pass through said materials of low work function without significant energy loss, thereby realizing stable electron emission.

Figure 10A:
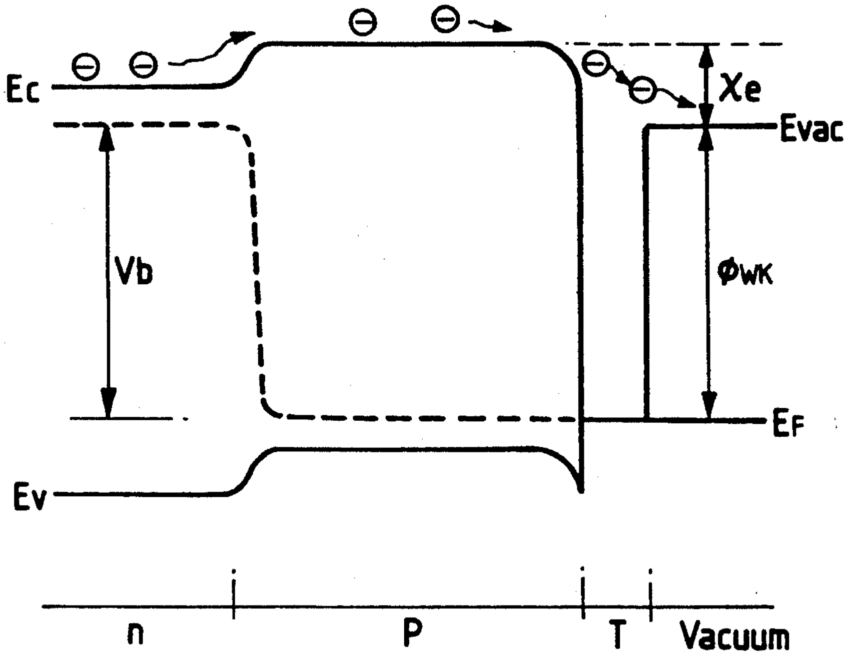
FIG. 10A is an energy band chart of an electron emitting semiconductor device of a second type employing diamond layers in p- and n-semiconductor layers.
Figure 10B:
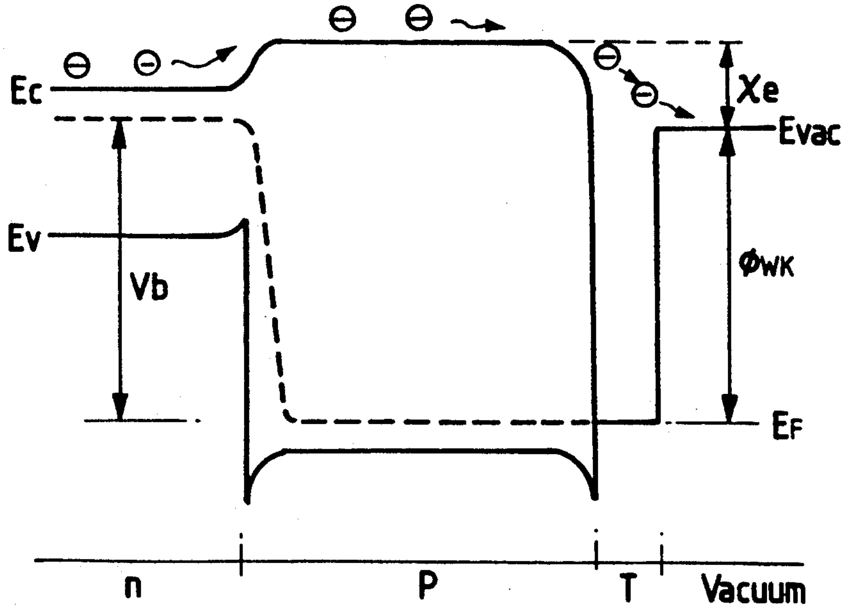
FIG. 10B is an energy band chart of a device of said second type employing a heterojunction.

In the following there will be an explanation of the function of an electron emitting semiconductor device of a second type of the present invention, with reference to FIGS. 10A and 10B, which are energy band charts of an electron emitting semiconductor device of said second type, wherein p indicates a p-semiconductor layer, and T indicates a layer of a material of low work function. FIG. 10A indicates a case where the pn junction is composed solely of diamond layers.

In the present invention, the p- or n-semiconductor also includes so-called $p^+$- or $n^+$-type with a high impurity concentration, unless specified otherwise.

First reference is made to FIG. 10A.

As diamond has a large band gap of 5.4 eV and a p-semiconductor doped with boron has an activation energy of 0.37 eV, the electron emitting part will have a surface of the NEA (negative electron affinity) state, in which the vacuum level is lower than the conduction band level of the semiconductor of the electron emitting side, thereby being capable of electron emission, if the material constituting said surface has a work function not exceeding 5.0 eV. Diamond, having a work function of 4.8 eV, is capable of electron emission. Also in case a layer of a metal or a metal compound of a low work function is formed on the p-diamond, selection of a suitable material can be made within a wider range of work function than in the conventional device because the band gap of diamond is as large as 5.4 eV. Particularly in case boron is selected as the impurity for the semiconductor, there can be a selection of a material with a work function not exceeding 5.0 eV. In the above-explained structure, application of a forward bias voltage $V_b$ across the junction between the p- and n-semiconductor layers induces electron injection from the n-diamond layer to the p-diamond layer, thereby enabling electron emission from the surface of said NEA state.

The structure shown in FIG. 10A employs diamond as the semiconductors constituting the pn junction, but it is also possible to realize the NEA state in an electron emitting device including a heterogeneous junction employing a n-semiconductor other than diamond, and to effect electron emission from the surface by an application of a forward bias voltage between the p-diamond layer and the n-semiconductor layer. FIG. 10B is an energy band chart in case of such heterojunction.

The electron emitting device utilizing such hetero junction also provides the advantages similar to those of the device utilizing pn junction of diamond only. Besides, though it is difficult to sufficiently reduce the resistance of the semiconductor by impurity doping in a material with a large band gap, such as diamond, because of the low effective density of the conduction band, it is possible to attain a low resistance by employing a n-semiconductor layer of a small band gap and by increasing the number of carrier electrons by means of a high concentration impurity doping, thereby increasing the number of emitted electrons and thus providing an electron emitting device fully exploiting the feature of diamond.

The diamond layer formation in the electron emitting semiconductor device of the second type can be achieved by known gaseous synthesis methods such as heating filament CVD, microwave plasma CVD, magnetic field coupled microwave plasma CVD, DC plasma CVD, RF plasma CVD or combustion flame method.

The raw material for carbon can be hydrocarbon gas such as methane, ethane, ethylene or acetylene; organic liquid such as alcohol or acetone; or carbon monoxide gas, which may be suitably added with hydrogen, oxygen and/or water.

The impurity for obtaining p-diamond layer can be an element of the group III of the periodic table, such as boron. Boron doping can be achieved by addition of a boron-containing compound to the raw material gas or by ion implantation.

When the n-semiconductor layer is composed of a diamond layer, diamond can be doped with an element of the group IV of the periodic table, such as nitrogen, or phosphor, or lithium. Said doping may be achieved by addition of gas containing such impurity to the raw material gas, or by ion implantation. When the n-semiconductor layer is composed of a semiconductor other than diamond, Si, Ge, or an element of the group II, III, V or VI of the periodic table such as In, As or P, or amorphous silicon or amorphous carbide may be employed. These materials may be doped with an impurity with a concentration of $1\times10^{20}$ atom/cm$^3$ or higher, thereby reducing the specific resistivity of the n-semiconductor layer to the level of $10^{-4}$ Ω.cm.

In the electron emitting device of the second type, the material to be provided on the p-semiconductor layer is required to have a work function not exceeding the energy band gap (5.4 eV) of diamond minus the activation energy in case of doping with an impurity element. The materials usable in case of boron doping are elements with a work function not exceeding 5.0 eV in the groups 1A-7A and 2B-4B of the periodic table; certain elements of the groups 8 and 1B of the periodic table such as Ir, Pt and Au; and various metal silicides, metal borides and metal carbides. Among these particularly preferred are certain elements such as Al, Ag, Cu and Rh. Also combinations of these elements and materials may be employed.

These materials can be deposited onto the semiconductor with extremely good controllability for example by electron beam evaporation, and a deposition film of 100 Å or less, preferably of a single atomic layer or several atomic layers allows the hot electrons to pass through said materials of low work function without significant energy loss, thereby realizing stable electron emission.

Among these materials of low work function, the high-melting metals such as tungsten, tantalum or molybdenum and the metal silicides, metal borides and metal carbides are chemically stabler than the materials of low work function employed in the surface of the conventional electron-emitting devices, such as cesium, and enable stable electron emission even under a relatively weak vacuum of ca. $10^{-3}$ Torr. Particularly silver is preferred because of its chemical stability and low electrical resistance.

In the following there will be am explanation of embodiments of the present invention, with reference to the attached drawings.

Embodiment 1

The present embodiment discloses a pn junction electron emitting device, belonging to the devices of the first type of the present invention.

Figure 1A:
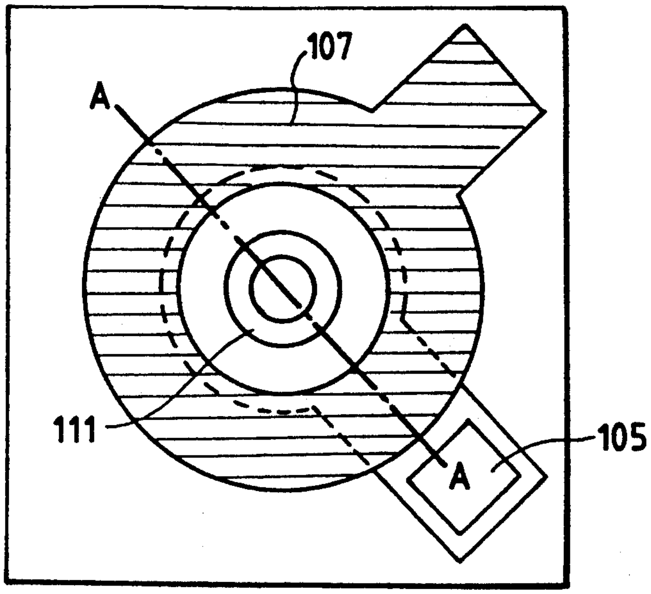
FIG. 1A is a plan view of a pn-junction electron emitting device constituting a first embodiment of the present invention.
Figure 1B:
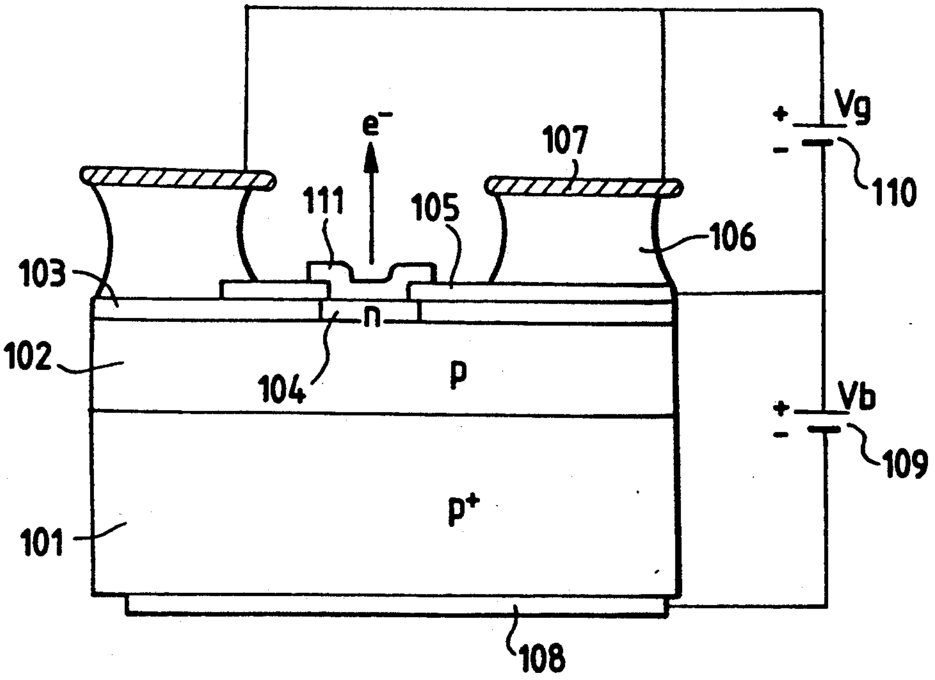
FIG. 1B is a cross-sectional view along a line A—A in FIG. 1A.

FIGS. 1A and 1B are respectively a plan view of said device and a cross-sectional view along a line A—A.

There are shown a $p^+$-semiconductor substrate 101, consisting of Si(100) in the present embodiment; a p-diamond layer 102; an insulating mask 103 for selective deposition, consisting of a $SiO_2$ layer; a n-diamond layer 104; a titanium electrode 105 for ohmic contact; an insulation layer 106; an extraction electrode 107; an ohmic contact electrode 108, consisting of aluminum evaporated onto the rear face of said Si substrate 101; a power source 109 for applying an inverse bias voltage $V_b$ between the electrodes 105 and 108; a power source 110 for applying a voltage $V_g$ between the electrodes 105 and 107; and an Ag layer (work function 4.26 eV) 111 for reducing the work function.

The device explained above was prepared in the following manner:

(1) On the $p^+$-Si substrate 101, the p-diamond layer 102 of a thickness of 1 μm was formed by heated filament CVD, under the conditions of a substrate temperature of 100° C., a pressure of 100 Torr, gas flow rates of $H_2$: 200 SCCM, $CH_4$: 1 SCCM and 100 ppm $B_2H_6$ (diluted with hydrogen): 1 SCCM, and a filament temperature of 2100° C.

(2) Then the $SiO_2$ mask 103 was formed in a predetermined position by a photolithographic process utilizing photoresist.

(3) Then the n-diamond layer 104 was formed by heated filament CVD under the same conditions as in (1) except the gas flow rates of $H_2$: 200 SCCM, $CH_4$: 1 SCCM and 100 ppm $PH_3$ (diluted with hydrogen): 5 SCCM.

The n-diamond was not deposited on the $SiO_2$ mask 103 but selectively on the aperture of said mask in which the diamond layer 102 was exposed.

(4) Then the Ti electrode 105, silver layer 111 (thickness 100 Å). $SiO_2$ insulation layer 106 and polysilicon extraction electrode 107 were formed with predetermined shapes by a photolithographic process.

In thus prepared electron-emitting semiconductor device, the inverse bias voltage $V_b$ applied between the electrodes 105 and 108 causes electron injection from the p-diamond layer 102 to the n-diamond layer 104 whereby the injected electrons penetrate through the n-diamond layer 104 and the silver layer 111 and enter the vacuum area. The electrons can be emitted from the device to the outside by the application of the extraction voltage $V_g$ between the extraction electrode 107 and the electrode 105.

In the present embodiment, the use of a diamond layer of high thermal conductivity suppressed the local heat generation in the device, thereby providing stable electron emitting characteristics. Also since the chemically unstable surface layer of cesium or cesium oxide was replaced by a silver layer which is chemically stable and resistant to thermal migration, stable electron emitting characteristics were obtained even at relatively weak vacuum ($2\times10^{-5}$ Torr in the present embodiment).

Embodiment 2

The present embodiment provides a pn junction device of the first type, which is however different from the device of the first embodiment utilizing a pn junction of diamond layers in utilizing a hetero junction between a p-diamond layer and an n-semiconductor other than diamond.

Figure 2:
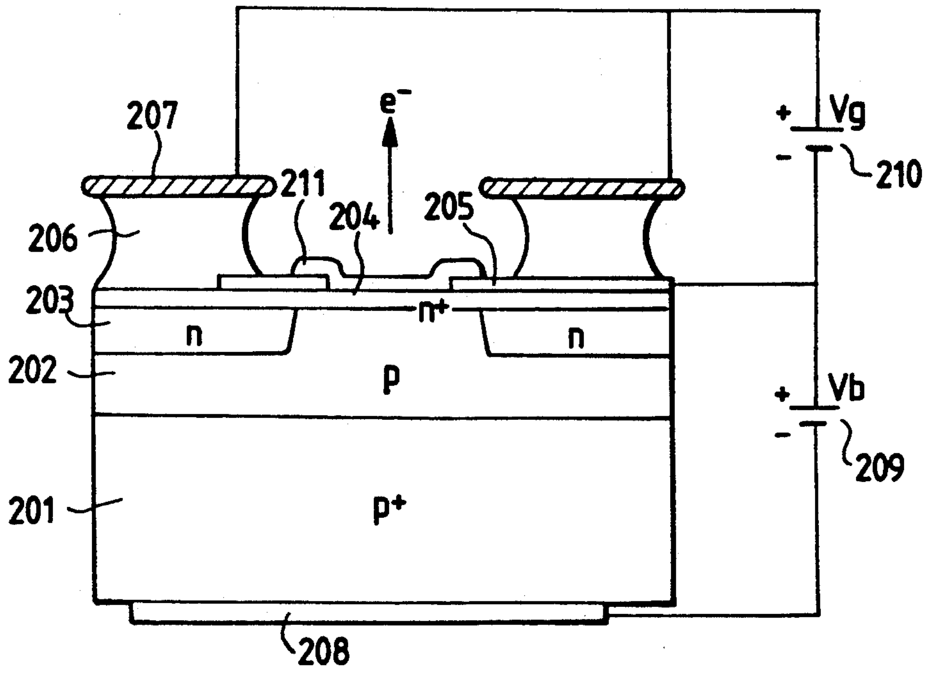
FIG. 2 is a cross-sectional view of a pn-junction electron emitting device constituting a second embodiment of the present invention.

FIG. 2 is a cross-sectional view of the pn-junction electron emitting device of the present embodiment, wherein shown are a $p^+$-semiconductor substrate 201 consisting of Si(100) in this embodiment; a p-diamond layer 202; an n-semiconductor layer 203; an $n^+$-germanium layer 204 constituting a hetero junction with the p-diamond layer 202; a titanium electrode 205 for ohmic contact; an insulation layer 206; an extraction electrode 207; an ohmic contact electrode 208 formed by aluminum evaporated on the rear face of the Si substrate 201; a power source 209 for applying an inverse bias voltage $V_b$ between the electrodes 205 and 208; a power source 210 for applying an extraction voltage $V_g$ between the electrode 205 and the extraction electrode 207; and an Ag layer 211 (work function 4.26 eV) for reducing the work function.

The above-explained device was prepared in the following manner:

(1) On the $p^+$-Si substrate 201, the p-diamond layer 202 of a thickness of 1.2 μm was prepared by heated filament CVD under the conditions of a substrate temperature of 1000° C., a pressure of 100 Torr, gas flow rates of $H_2$: 200 SCCM, $CH_4$: 1 SCCM and 100 ppm $B_2H_6$ (diluted with hydrogen): 1 SCCM and a filament temperature of 2100° C.;

(2) Then the n-semiconductor layer 203 was formed by phosphor ion implantation in a predetermined area, followed by annealing;

(3) Then the $n^+$-germanium layer 204 of a thickness of 100 Å was formed with an impurity concentration of ca. $1\times10^{20}$ atom/cm$^3$ by MBE, thereby forming a hetero junction with the p-diamond layer. The resistance of said Ge layer was as low as $3\times10^{-4}$ Ω.cm;

(4) The titanium electrode 205, Ag layer (thickness 20 Å) 211, $SiO_2$ insulation layer 206 and polysilicon extraction electrode 207 were prepared in predetermined shapes by a photolithographic process.

In thus prepared electron-emitting semiconductor device, an inverse bias voltage Vb applied between the electrodes 205, 208 causes an avalanche amplification on the heterojunction interface between the p-diamond layer 202 and the $n^+$-germanium layer 204, whereby the generated hot electrons penetrate through the $n^+$-germanium layer 204 and the Ag layer 211 to enter the vacuum area. The electrons can be emitted from the device to the outside by the application of the extraction voltage $V_g$ between the extraction electrode 207 and the electrode 205.

In the present embodiment, the n-semiconductor layer is composed of germanium, but it may also be composed of other materials such as amorphous carbon or amorphous silicon.

Due to the use of a diamond layer of high thermal conductivity, the present embodiment allowed to suppress the local heat generation in the device, thereby achieving stable electron emitting characteristics. The present embodiment could further suppress the heat generation of the device, because the n ($n^+$) layer was composed of germanium which was reduced in resistance by impurity doping, for forming the heterogenous junction with the p-diamond layer. Furthermore, as the chemically unstable surfacial layer of cesium or cesium oxide was replaced by the silver layer which is chemically stable and resistant to migration, stable electron emission could be realized even under relatively weak vacuum of ca. $2\times10^{-5}$ Torr in the present embodiment.

Embodiment 3

The present embodiment discloses a Shottky junction electron emitting semiconductor device belonging to the first type device of the present invention.

Figure 4A:
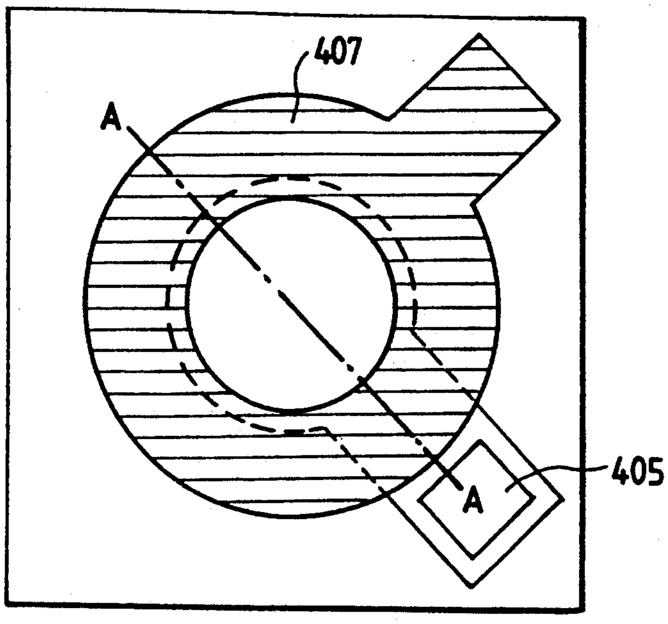
FIG. 4A is a plan view of a Schottky junction electron emitting device constituting a third embodiment of the present invention.
Figure 4B:
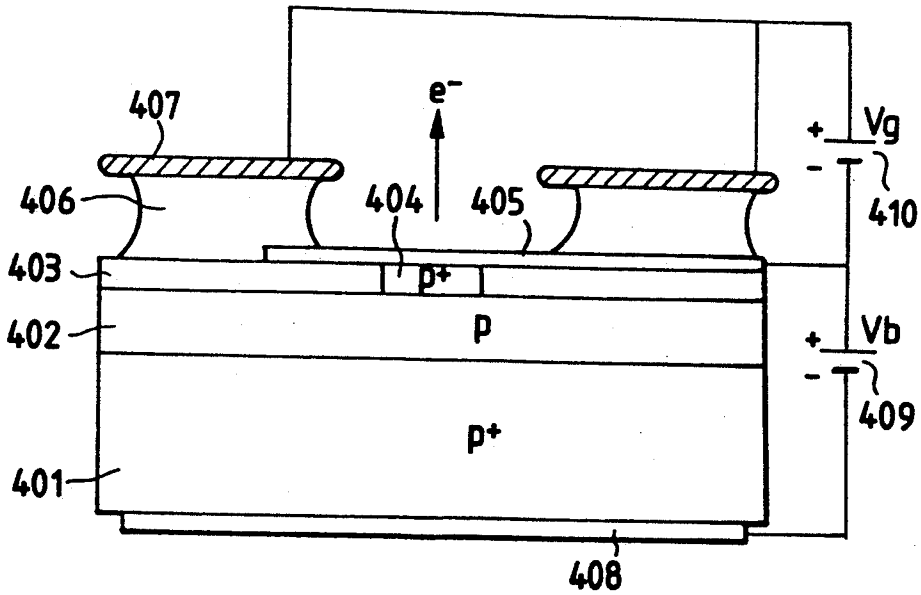
FIG. 4B is a cross-sectional view along a line A—A in FIG. 4A.

FIGS. 4A and 4B are respectively a plan view of said Schottky junction device and a cross-sectional view along a line A—A in FIG. 4A, wherein shown are a $p^+$-semiconductor substrate 401, consisting of Si(100) in the present embodiment, a p-diamond layer 402; an insulating mask 403 for selective deposition, composed of a $SiO_2$ layer; a $p^+$-diamond layer 404; a Shottky electrode 405, composed of tungsten (work function 4.55 eV); an insulation layer 406; an extraction electrode 407; an ohmic contact electrode 408 composed of aluminum deposited by evaporation on the rear face of said Si substrate 401; a power source 409 for applying an reverse bias voltage $V_b$ between the Schottky electrode 405 and the electrode 408; and a power source 410 for applying an extraction voltage $V_g$ between the Schottky electrode 405 and the extraction electrode 407.

The above-explained device was prepared in the following manner:

(1) On the $p^+$-Si substrate 401, the p-diamond layer 402 of a thickness of 1 μm was formed by heated filament CVD under the conditions of a substrate temperature of 1000° C., a pressure of 100 Torr, gas flow rates of $H_2$: 200 SCCM, $CH_4$: 1 SCCM and 100 ppm $B_2H_6$ (diluted with hydrogen): 1 SCCM, and a filament temperature of 2100° C.;

(2) Then the $SiO_2$ mask 403 was formed in a predetermined position by a photolithographic process utilizing photoresist;

(3) Then the $p^+$-diamond layer 404 of a thickness of 1000 Å was formed by heated filament CVD under the same conditions as in (1) except for the gas flow rates of $H_2$: 200 SCCM, $CH_4$: 1 SCCM and 100 ppm $B_2H_6$ (diluted with hydrogen): 5 SCCM.

The p+-diamond was not deposited on the $SiO_2$ mask 403 but solely on the aperture, exposing the diamond layer 402, of said mask;

(4) The tungsten electrode (thickness 100 Å) 405, $SiO_2$ insulation layer 406 and polysilicon extraction electrode 407 were formed with predetermined forms by a photolithographic process.

In thus prepared electron-emitting semiconductor device, an inverse bias voltage $V_b$ applied between the Shottky electrode 405 and the electrode 408 induces an avalanche amplification at the interface between the p+-diamond layer 404 and the Schottky electrode 405, and the resulting hot electrons passes through the Schottky electrode 405, thus entering the vacuum area and are emitted form the device to the outside by an extraction voltage $V_g$ applied between the extraction electrode 407 and the Shottky electrode 405.

Due to the use of a diamond layer of high thermal conductivity, the present embodiment was capable of suppressing the local heat generation in the device, thereby providing stable electron emitting characteristics. Also the use of chemically stable tungsten as the material constituting the Schottky electrode avoided migration and provided stable electron emitting characteristics.

Embodiment 4

The present embodiment utilizes formation of a p+-diamond layer by ion implantation.

Figure 5:
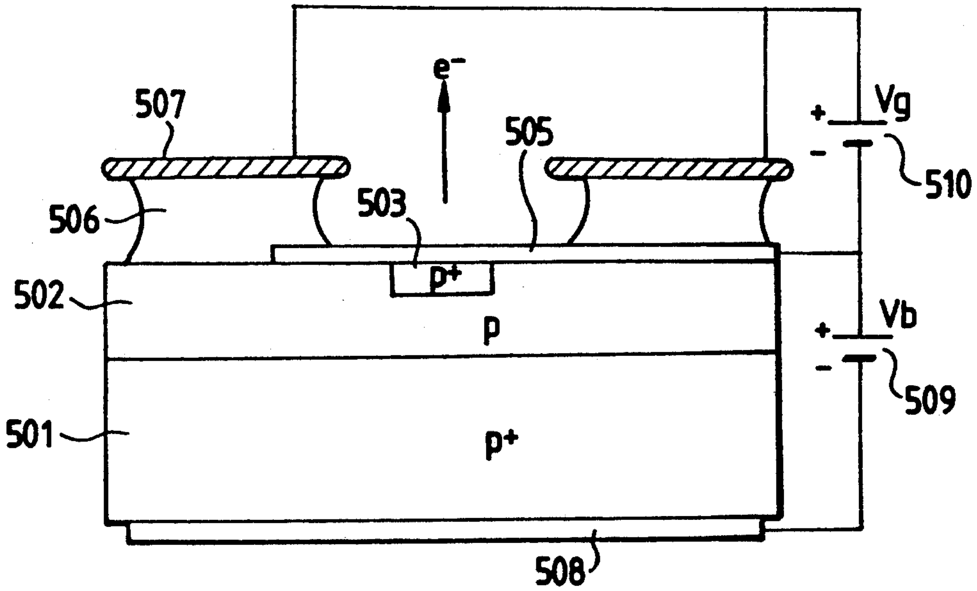
FIG. 5 is a cross-sectional view of a Schottky junction electron emitting device constituting a fourth embodiment of the present invention.

FIG. 5 is a cross-sectional view of a Schottky junction electron emitting device of the present embodiment, wherein shown are a p+-semiconductor substrate 501, consisting of Si(100) in the present embodiment; a p-diamond layer 502, a p+-diamond layer 503; a Schottky electrode 505, composed of tantalum (work function 4.25 eV); an insulation layer 506; an extraction electrode 507; an ohmic contact electrode 508 composed of aluminum deposited by evaporation on the rear face of said Si substrate 501; a power source 509 for applying an inverse bias voltage $V_b$ between the Schottky electrode 505 and the electrode 508; and a power source 510 for applying an extraction voltage $V_g$ between the Schottky electrode 505 and the extraction electrode 507.

The above-explained device was prepared in the following manner:

(1) On the p+-Si substrate 501, the p-diamond layer 502 of a thickness of 1 μm was formed by heated filament CVD under the conditions of a substrate temperature of 1000° C., a pressure of 100 Torr, gas flow rates of $H_2$:200 SCCM, $CH_4$: 1 SCCM, and 100 ppm $B_2H_6$ (diluted with hydrogen): 1 SCCM, and a filament temperature of 2100° C.;

(2) Then the p+-diamond layer 503 was formed by implanting boron with a focused ion beam (FIB) apparatus into a predetermined area with an energy of 40 keV and with a concentration of ca. $5\times10^{17}/cm^3$;

(3) The tantalum electrode (thickness 100 Å) 505, $SiO_2$ insulation layer 506 and polysilicon extraction electrode 507 were prepared with predetermined forms by a photolithographic process.

In the thus prepared electron-emitting semiconductor conductor device, an inverse bias voltage $V_b$ applied between the Schottky electrode 505 and the electrode 508 induces an avalanche amplification at the interface between the p+-diamond layer 503 and the Schottky electrode 505, whereby the generated hot electrons pass through the Shottky electrode 505, thus entering the vacuum area, and can be emitted from the device to the outside by an extraction voltage $V_g$ applied between the Schottky electrode 505 and the extraction electrode 507.

Also the present embodiment provided stable electron emitting characteristics as in the embodiment 3.

Embodiment 5

Figure 7A:
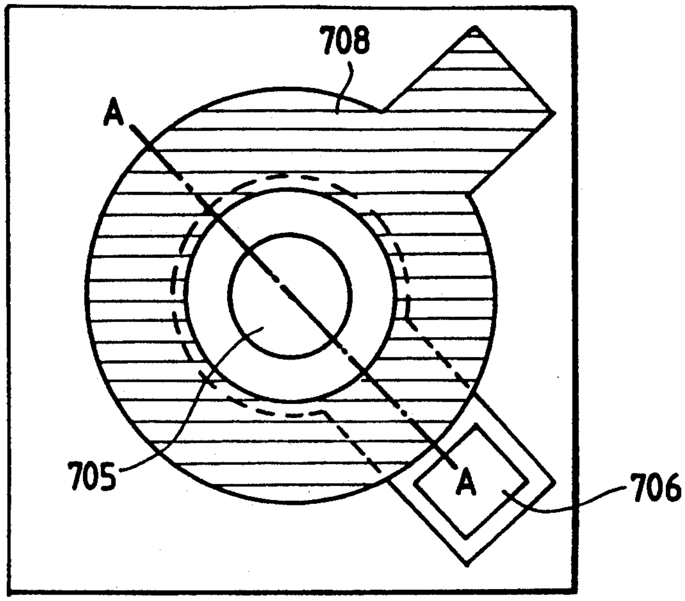
FIG. 7A is a plan view of an electron emitting semiconductor device constituting a fifth embodiment of the present invention.
Figure 7B:
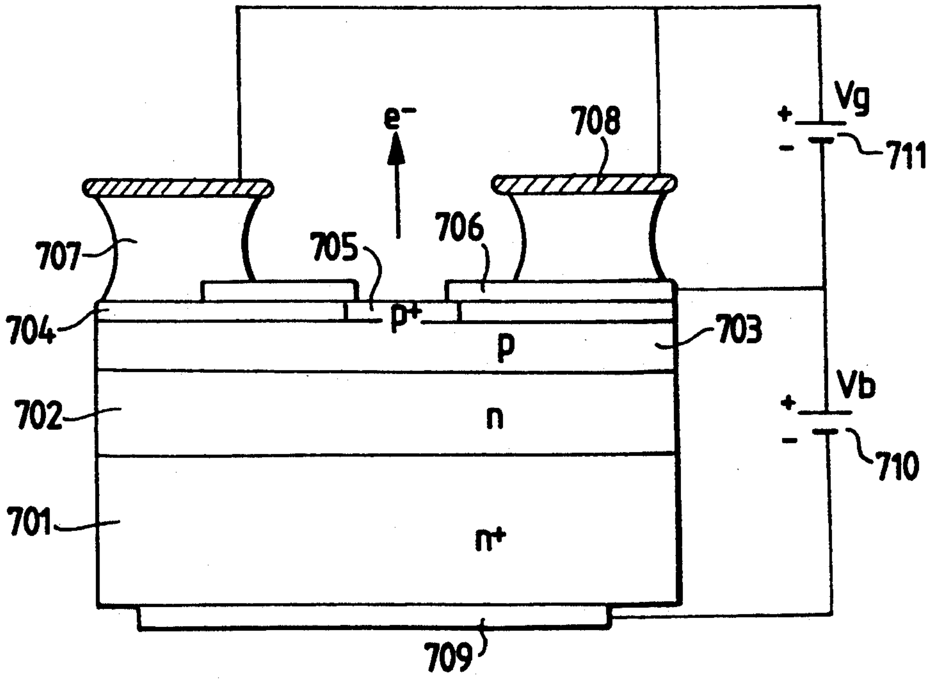
FIG. 7B is a cross-sectional view along a line A—A in FIG. 7A.

FIG. 7A is a plan view of an electron emitting semiconductor device constituting a fifth embodiment of the present invention, and FIG. 7B is a cross-sectional view along a line A—A in FIG. 7A.

There are shown an n+-semiconductor substrate 701, consisting of Si(100) in the present embodiment; an n-diamond layer 702; a p-diamond layer 703; an insulating mask 704 for selective deposition, composed of a $SiO_2$ layer in this case; a p+-diamond layer 705; a titanium electrode 706 for ohmic contact; an insulation layer 707; an extraction electrode 708; an ohmic contact electrode 709 composed of aluminum deposited by evaporation on the rear face of said Si substrate 701; a power source 710 for applying a forward bias voltage between the electrodes 706 and 709; and a power source 711 for applying an extraction voltage $V_g$ between the electrode 706 and the extraction electrode 708.

The above-explained device was prepared in the following manner:

(1) On the n+-Si substrate 701, the n-diamond layer 702 of a thickness of 2 μm was formed by heated filament CVD under the conditions of a substrate temperature of 1000° C., a pressure of 100 Torr, gas flow rates of $H_2$: 200 SCCM, $CH_4$: 1 SCCM, and 100 ppm $PH_3$ (diluted with hydrogen): 1 SCCM, and a filament temperature of 2100° C.;

(2) Then the p-diamond layer 703 of a thickness of 2000 Å was formed by heated filament CVD under the conditions of a substrate temperature of 1000° C., a pressure of 100 Torr, gas flow rates of $H_2$: 200 SCCM, $CH_4$: 1 SCCM and 100 ppm $B_2H_6$ (diluted with hydrogen): 1 SCCM, and a filament temperature of 2100° C.;

(3) The $SiO_2$ mask 704 was formed in a predetermined position by a photolithographic process utilizing photoresist;

(4) Then the p+-diamond layer 705 of a thickness of 1000 Å was formed by heated filament CVD under the same conditions as in (2) except for the gas flow rates of $H_2$: 200 SCCM, $CH_4$: 1 SCCM, and 100 ppm $B_2H_6$ (diluted with hydrogen): 5 SCCM.

The p+-diamond was not deposited on the $SiO_2$ mask 704 but solely on the aperture exposing the diamond layer 703, of the mask;

(5) The titanium electrode 706, $SiO_2$ insulation layer 707 and polysilicon extraction electrode 708 were formed with predetermined forms, by a photolithographic process.

In thus prepared electron-emitting semiconductor device, a forward bias voltage $V_b$ applied between the electrodes 706 and 709 causes electron injection from the n-diamond layer 702 into the p-diamond layer 703, and the thus injected electrons pass through the p+-diamond layer 705, thus entering the vacuum area, and are emitted from the device to the outside by an extraction voltage $V_g$ applied between the extraction electrode 708 and the electrode 706.

The present embodiment was capable of electron emission without the work function reducing material, since the work function of the diamond itself is 4.8 eV so that a negative electron affinity state could be established on the surface. Also the use of diamond layer with high thermal conductivity suppressed the local heat generation in the device, thus providing stable electron emission.

Embodiment 6

The present embodiment utilizes a layer of a work function reducing material on the surface of the p+-semiconductor layer, for achieving further reduction of the work function.

Figure 8A:
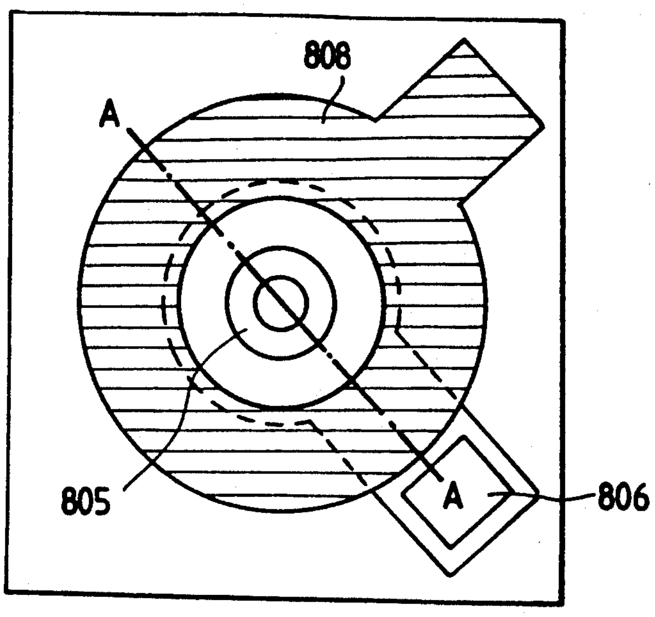
FIG. 8A is a plan view of an electron emitting semiconductor device constituting a sixth embodiment of the present invention.
Figure 8B:
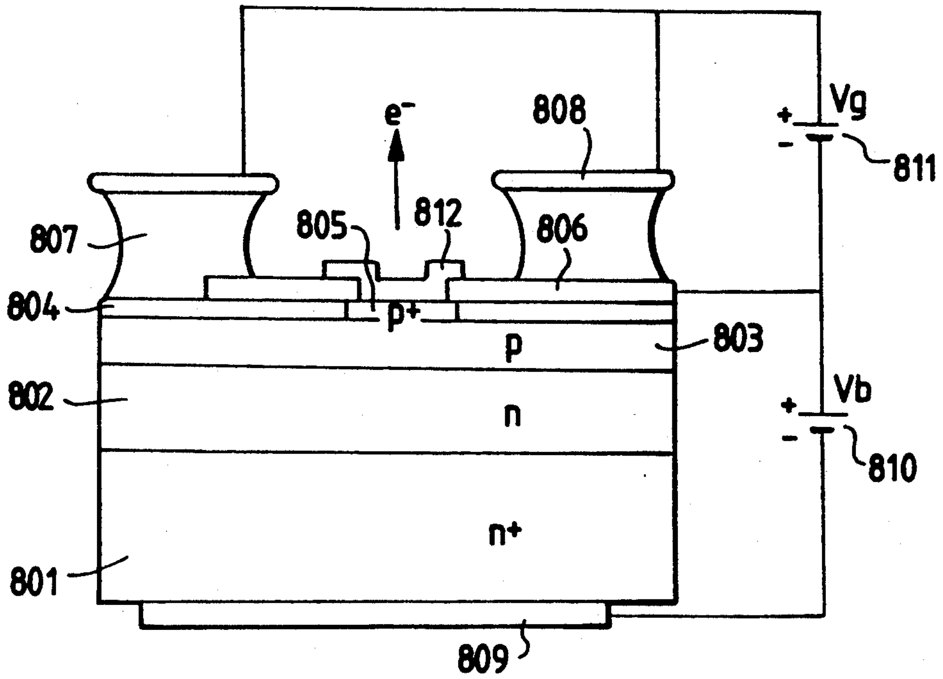
FIG. 8B is a cross-sectional view along a line A—A in FIG. 8A.

FIG. 8A is a plan view of an electron emitting semiconductor device of the present embodiment, and FIG. 8B is a cross-sectional view along a line A—A in FIG. 8A.

There are shown an n+-semiconductor substrate 801, consisting of Si(100) in the present embodiment; an n-diamond layer 802; a p-diamond layer 803; an insulation mask 804 for selective deposition, composed of a $SiO_2$ layer in this case; a p+-diamond layer 805; a titanium electrode 806 for ohmic contact; an insulation layer 807; an extraction electrode 808; an ohmic contact electrode 809 composed of aluminum deposited by evaporation on the rear face of said Si substrate 801; a power source 810 for applying a forward bias voltage $V_b$ between the electrodes 806 and 809; a power source 811 for applying an extraction voltage $V_g$ between the electrode 806 and the extraction electrode 808; and a silver layer 812 of a low work function (4.26 eV).

The above-explained device was prepared by a process similar to that in the foregoing embodiment 5, wherein, in the step (5), the silver layer 212 was prepared in a predetermined form by a photolithographic process.

In thus prepared electron-emitting semiconductor device, a forward bias voltage $V_b$ applied between the electrodes 806 and 809 induces electron injection from the n-diamond layer 802 into the p-diamond layer 803, whereby the injected electrons - enter the vacuum area through the p+-diamond layer 805 and the silver layer 812, and can be emitted from the device to the outside by an extraction voltage $V_g$ applied between the extraction electrode 808 and the electrode 806.

The present embodiment was capable of suppressing the local heat generation of the device and providing stable electron emitting characteristics by the use of a diamond layer of high thermal conductivity. Also the layer of low work function, to be provided on the surface of the p-semiconductor layer, need not be composed of cesium or cesium oxide which is chemically unstable but can be composed of chemically stable silver, so that stable electron emission characteristics could be obtained even under relatively weak vacuum, which was $2\times10^{-5}$ Torr in the present embodiment.

Embodiment 7

In contrast to the foregoing embodiments 5 and 6 utilizing pn junction composed of diamond layers, the present embodiment utilizes a heterogeneous junction composed of a p-diamond layer and an n-semiconductor other than diamond.

Figure 9:
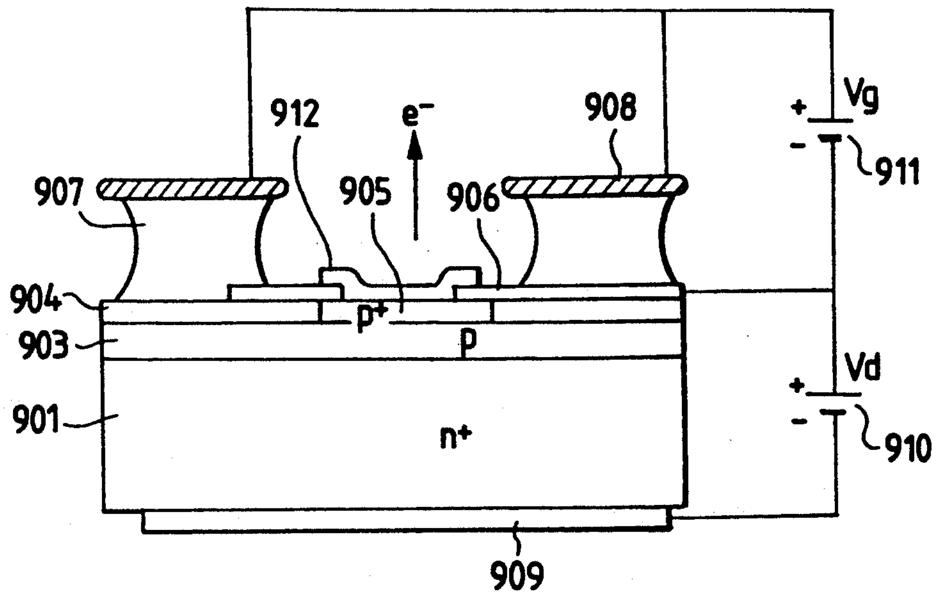
FIG. 9 is a cross-sectional view of an electron emitting semiconductor device constituting a seventh embodiment of the present invention.

FIG. 9 is a cross-sectional view of an electron emitting semiconductor device of the present embodiment.

There are shown an n+-semiconductor substrate 901, consisting, in the present embodiment, of Si(100) doped with phosphor with a concentration of ca. $1\times10^{20}$ atom/cm$^3$ a specific resistivity of ca. $1\times10^{-4}$ Ω.cm; a p-diamond layer 903 constituting a heterojunction with the Si substrate 901; an insulating mask 904 for selective deposition, composed of a $SiO_2$ layer in this case; a p+-diamond layer 905; a titanium electrode 906 for ohmic contact; an insulation layer 907; an extraction electrode 908; an ohmic contact electrode 909 composed of aluminum deposited by evaporation on the rear face of said Si substrate 901; a power source 910 for applying a forward bias voltage $V_b$ between the electrodes 906 and 909; a power source 911 for applying an extraction voltage $V_g$ between the electrode 906 and the extraction electrode 908; and an aluminum layer 912 of a low work function (4.28 eV).

The above-explained device was prepared in the following manner:

(1) On the n+-Si substrate 901, the p-diamond layer 903 of a thickness of 5000 Å was formed by heated filament CVD, under the conditions of a substrate temperature of 1000° C., a pressure of 100 Torr, gas flow rates of $H_2$: 200 SCCM, $CH_4$: 1 SCCM, and 100 ppm $B_2H_6$ (diluted with hydrogen): 1 SCCM, and a filament temperature of 2100° C.;

(2) Then the $SiO_2$ mask 904 was formed in a predetermined position by a photolithographic process utilizing photoresist;

(3) Then the p+-diamond layer 305 of a thickness of 1000 Å was formed by heated filament CVD under the same conditions as in (1), except for the gas flow rates of $H_2$: 200 SCCM, $CH_4$: 1 SCCM and 100 ppm $B_2H_6$ (diluted with hydrogen): 5 SCCM.

The p+-diamond was not deposited on the $SiO_2$ mask 904 but selectively on the aperture, exposing the diamond layer 903, of said mask;

(4) The titanium electrode 906, aluminum layer (100 Å) 912, $SiO_2$ insulation layer 907 and polysilicon extraction electrode 908 were prepared with predetermined forms by a photolithographic process.

The n-semiconductor layer in the present embodiment was composed of silicon, but it may also be composed of other materials such as amorphous carbon or amorphous silicon.

In thus prepared electron-emitting semiconductor device, a forward bias voltage $V_b$ applied between the electrodes 906 and 909 induces electron injection from the n-diamond layer 902 into the p-diamond layer 903, whereby the injected electrons enter the vacuum area through the p+-diamond layer 905 and the aluminum layer 912 and can be emitted from the device to the outside by an extraction voltage $V_g$ applied between the extraction electrode 908 and the electrode 906.

The present embodiment, due to the use of a diamond layer of high thermal conductivity, was capable of suppressing the local heat generation in the device, thereby providing stable electron emitting characteristics. Also since the n+-semiconductor was composed, instead of diamond, of silicon with a small energy band gap and with a lowered resistance achieved by highly concentrated impurity doping, the present embodiment could increase the number of carrier electrons, thereby achieving efficient electron emission. Also the chemically unstable surfacial layer of cesium or cesium oxide could be replaced by a chemically stable aluminum layer, so that stable electron emitting characteristics could be obtained even under relatively weak vacuum, which was $2\times10^{-5}$ Torr in the present embodiment.

In the present embodiment, the p-diamond layer is formed directly on the $n^+$-semiconductor substrate, but it is also possible to form an n-type layer of a small energy band gap, different from diamond, between the $n^+$-semiconductor substrate and the p-semiconductor layer.

As explained in the foregoing, the electron-emitting semiconductor device of the present invention is capable of suppressing the local heat generation of the device, thereby providing stable electron emitting characteristics and also extending the service life of the device, due to the use of a diamond semiconductor layer of high thermal conductivity.

Also the wide energy band gap of the diamond semiconductor layer allows the use, as a Shottky electrode or as a work function reducing material, of a material of a relatively large work function, chemically stable and resistant to thermal migration, whereby a highly reliable device can be obtained.

Also the electron emitting semiconductor device of the present invention employs a diamond semiconductor at least in the p-semiconductor layer, and said diamond semiconductor forms a surface of the negative electron affinity state, because of a wide energy band gap and a low work function. Consequently electron emission is enabled without a layer of a work function reducing material on the surface of said p-semiconductor layer.

Also the use of a diamond semiconductor layer of high thermal conductivity suppresses the local heat generation of the device, thereby providing stable electron emitting characteristics.

Also its wide energy band gap enables to use a chemically stable material with a relatively large work function for reducing the work function, whereby a highly reliable device can be obtained.

Consequently the electron-emitting semiconductor device of the present invention allows to provide display, electron beam writing apparatus, vacuum tube, electron beam printer, memory or the like with improved reliability.

What is claimed is:

1. An electron emitting device provided with a p-semiconductor layer formed on a semiconductor substrate, wherein said p-semiconductor layer is composed of a diamond layer.

2. An electron emitting device comprising a p-semiconductor layer formed on a semiconductor substrate and an electron avalanche inducing layer so formed as to constitute a pn junction with said p-semiconductor layer for inducing an electron avalanche breakdown in cooperation with said p-semiconductor layer, wherein electron emission is achieves by application of a reverse bias between said p-semiconductor layer and said electron avalanche inducing layer; and wherein a diamond layer is used as said p-semiconductor layer and an n-semiconductor layer is used as said electron avalanche inducing layer.

3. An electron emitting device comprising a p-semiconductor layer formed on a semiconductor substrate and an electron avalanche inducing layer so formed as to constitute a pn junction with said p-semiconductor layer for inducing an electron avalanche breakdown in cooperation with said p-semiconductor layer, wherein electron emission is achieved by application of a reverse bias between said p-semiconductor layer and said electron avalanche inducing layer; and wherein a diamond layer is used as said p-semiconductor layer and an n-semiconductor diamond layer is used as said electron avalanche inducing layer.

4. An electron emitting device comprising a p-semiconductor layer formed on a semiconductor substrate and an electron avalanche inducing layer so formed as to constitute a Schottky junction with said p-semiconductor layer inducing an electron avalanche breakdown in cooperation with said p-semiconductor layer, wherein electron emission is achieved by application of a reverse bias between said p-semiconductor layer and said electron avalanche inducing layer; and wherein a diamond layer is used as said p-semiconductor layer and a Schottky electrode with a thickness no greater than 500 Å is used as said electron avalanche inducing layer.

5. An electron emitting device comprising a p-semiconductor layer formed on a semiconductor substrate, an electron avalanche inducing layer so formed as to constitute a pn junction with said p-semiconductor layer for inducing an electron avalanche breakdown in cooperation with said p-semiconductor layer, and a metal layer on said electron avalanche inducing layer, wherein electron emission is achieved by application of a reverse bias between said p-semiconductor layer and said electron avalanche inducing layer; and wherein a diamond layer is used as said p-semiconductor layer, an n-semiconductor layer is used as said avalanche inducing layer, and said metal layer has a work function no greater than an energy band gap width of said p-semiconductor layer.

6. An electron emitting device comprising a p-semiconductor layer formed on a semiconductor substrate, an electron avalanche inducing layer so formed as to constitute a pn junction with said p-semiconductor layer for inducing an electron avalanche breakdown in cooperation with said p-semiconductor layer, and a metal layer on said electron avalanche inducing layer, wherein electron emission is achieved by application of a reverse bias between said p-semiconductor layer and said electron avalanche inducing layer; and wherein a diamond is used as said p-semiconductor layer, an n-semiconductor layer is used as said avalanche inducing layer, and said metal layer has a thickness not greater than 100 Å and a work function no greater than an energy band gap width of said p-semiconductor layer.

7. An electron emitting device comprising a p-semiconductor layer formed on a semiconductor substrate, an electron avalanche inducing layer so formed as to constitute a pn junction with said p-semiconductor layer for inducing an electron avalanche breakdown in cooperation with said p-semiconductor layer and a metal layer on said electron avalanche inducing layer, wherein electron emission is achieved by application of a reverse bias between said p-semiconductor layer and said electron avalanche inducing layer; and wherein a diamond layer is used as said p-semiconductor layer and an n-semiconductor diamond layer is used as said avalanche inducing layer, and said metal layer has a work function no greater than an energy band gap width of said p-semiconductor layer.

8. An electron emitting device comprising a p-semiconductor layer formed on a semiconductor substrate, an electron avalanche inducing layer so formed as to constitute a pn junction with said p-semiconductor layer for inducing an electron avalanche breakdown in cooperation with said p-semiconductor layer, and a metal layer on said electron avalanche inducing layer, wherein electron emission is achieved by application of a reverse bias between said p-semiconductor layer and said electron avalanche inducing layer; and wherein a diamond layer is used as said p-semiconductor layer, an n-semiconductor diamond layer is used and said electron avalanche inducing layer and said metal layer has a thickness no greater than 100 Å and a work function no greater than an energy band gap width of said p-semiconductor layer.

9. An electron emitting device comprising a p-semiconductor layer formed on a semiconductor substrate, an electron avalanche inducing layer so formed as to constitute a Schottky junction with said p-semiconductor layer for inducing an electron avalanche breakdown in cooperation with said p-semiconductor layer and a metal compound layer on said electron avalanche inducing layer, wherein electron emission is achieved by application of a reverse bias between said p-semiconductor layer and said electron avalanche inducing layer; and wherein a diamond layer is used as said semiconductor layer and a Schottky electrode with a thickness no greater than 500 Å is used as said electron avalanche inducing layer and said metal compound layer has a work function no greater than an energy band gap width of said p-semiconductor layer.

10. An electron emitting device comprising a p-semiconductor layer formed on a semiconductor substrate, an electron avalanche inducing layer so formed as to constitute a Schottky junction with said p-semiconductor layer for inducing an electron avalanche breakdown in cooperation with said p-semiconductor layer, and a metal compound layer on said electron avalanche inducing layer, wherein electron emission is achieved by application of a reverse bias between said p-semiconductor layer and said electron avalanche inducing layer; and wherein a diamond layer is used as said p-semiconductor layer and a Schottky electrode with a thickness no greater than 500 Å is used as said electron avalanche inducing layer and said metal compound layer has a thickness no greater than 100 Å and a work function no greater than an energy band gap width of said p-semiconductor layer.

11. An electron emitting device comprising a p-semiconductor layer formed on a semiconductor substrate, an electron avalanche inducing layer so formed as to constitute a pn junction with said p-semiconductor layer for inducing an electron avalanche breakdown in cooperation with said p-semiconductor layer, and a metal compound layer on said electron avalanche inducing layer, wherein electron emission is achieved by application of a reverse bias between said p-semiconductor layer and said electron avalanche inducing layer; and wherein a diamond layer is used as said p-semiconductor layer, and an n-semiconductor is used as said electron avalanche inducing layer and said metal compound layer has a work function no greater than an energy band gap width of said p-semiconductor layer.

12. An electron emitting device comprising a p-semiconductor layer formed on a semiconductor substrate, an electron avalanche inducing layer so formed as to constitute a pn junction with said p-semiconductor layer for inducing an electron avalanche breakdown in cooperation with said p-semiconductor layer, and a metal compound layer on said electron avalanche inducing layer, wherein electron emission is achieved by application of a reverse bias between said p-semiconductor layer and said electron avalanche inducing layer; and wherein a diamond layer is used as said p-semiconductor layer, and an n-semiconductor is used as said electron avalanche inducing layer and said metal compound layer has a thickness no greater than 100 Å and has a work function no greater than an energy band gap width of said p-semiconductor layer.

13. An electron emitting device comprising a p-semiconductor layer formed on a semiconductor substrate, an electron avalanche inducing layer so formed as to constitute a pn junction with said p-semiconductor layer for inducing an electron avalanche breakdown in cooperation with said p-semiconductor layer, and a metal compound layer on said electron avalanche inducing layer, wherein electron emission is achieved by application of a reverse bias between said p-semiconductor layer and said electron avalanche inducing layer; and wherein a diamond layer is used as said p-semiconductor layer, and an n-semiconductor diamond is used as said electron avalanche inducing layer, and said metal compound layer has a work function no greater than an energy band gap width of said p-semiconductor layer.

14. An electron emitting device comprising a p-semiconductor layer formed on a semiconductor substrate, wherein said p-semiconductor layer is composed of a diamond layer, an electron avalanche inducing layer so formed as to constitute a pn junction with said p-semiconductor layer for inducing an electron avalanche breakdown in cooperation with said p-semiconductor layer, and a metal compound layer on said electron avalanche inducing layer, wherein electron emission is achieved by application of a reverse bias between said p-semiconductor layer and said electron avalanche inducing layer; and wherein a diamond layer is used as said p-semiconductor layer, and an n-semiconductor diamond is used as said electron avalanche inducing layer, and said metal compound layer has a thickness no greater than 100 Å and a work function no greater than an energy band gap width of said p-semiconductor layer.

15. An electron emitting device comprising a p-semiconductor layer formed on a semiconductor substrate, wherein said p-semiconductor layer is composed of a diamond layer, an electron avalanche inducing layer so formed as to constitute a Schottky junction with said p-semiconductor layer for inducing an electron avalanche breakdown in cooperation with said p-semiconductor layer and metal layer on said electron avalanche inducing layer, wherein electron emission is achieved by application of a reverse bias between said p-semiconductor layer and said electron avalanche inducing layer; and wherein a diamond layer is used as said p-semiconductor layer, and a Schottky electrode with a thickness no greater than 500 Å is used as said electron avalanche inducing layer, and said metal layer has a work function no greater than an energy band gap.

16. An electron emitting device comprising a p-semiconductor layer formed on a semiconductor substrate, wherein said p-semiconductor layer is composed of a diamond layer, an electron avalanche inducing layer so formed as to constitute a Schottky junction with said p-semiconductor layer for inducing an electron avalanche breakdown in cooperation with said p-semiconductor layer and a metal layer on said electron avalanche inducing layer, wherein electron emission is achieved by application of a reverse bias between said p-semiconductor layer and said electron avalanche inducing layer; and wherein a diamond layer is used as said p-semiconductor layer, and a Schottky electrode with a thickness no greater than 500 Å is used as said electron avalanche inducing layer, and said metal layer has a thickness no greater than 100 Å and a work function no greater than an energy band gap.

17. AN electron emitting device comprising a p-semiconductor layer formed on a semiconductor substrate, and an electron avalanche inducing layer so formed as to constitute a heterojunction with said p-semiconductor layer for inducing an electron avalanche breakdown in cooperation with said p-semi-conductor layer, wherein electron emission is achieved by application of a reverse bias between said p-semiconductor layer and said electron avalanche inducing layer; and wherein a diamond layer is used as said p-semiconductor layer, and an n-semiconductor layer produced by a material different from the diamond and having an energy band gap no greater than the diamond is used as said electron avalanche inducing layer.

18. An electron emitting device comprising a p-semiconductor layer formed on a semiconductor substrate, and an electron avalanche inducing layer so formed as to constitute a heterojunction with said p-semiconductor layer for inducing an electron avalanche breakdown in cooperation with said p-semiconductor layer, and a metal layer formed on said electron avalanche inducing layer, wherein electron emission is achieved by application of a reverse bias between said p-semiconductor layer and said electron avalanche inducing layer; and wherein a diamond layer is used as said p-semiconductor layer, and an n-semiconductor layer produced by a material different from the diamond and having an energy band gap no greater than the diamond is used as said electron avalanche inducing layer, and said metal layer has a work function no greater than an energy bandgap width of said p-semiconductor layer.

19. An electron emitting device comprising a p-semiconductor layer formed on a semiconductor substrate, an electron avalanche inducing layer so formed as to constitute a heterojunction with said p-semiconductor layer for inducing an electron avalanche breakdown in cooperation with said p-semiconductor layer, and a metal layer formed on said electron avalanche inducing layer, wherein electron emission is achieved by application of a reverse bias between said p-semiconductor layer and said electron avalanche inducing layer; and wherein a diamond layer is used as said p-semiconductor layer, an n-semiconductor layer produced by a material different from the diamond and having an energy band gap no greater than the diamond is used as said electron avalanche inducing layer, and said metal layer has a thickness no greater than 100 Å and with a work function no greater than an energy bandgap width of said p-semiconductor layer.

20. An electron emitting device comprising a p-semiconductor layer formed on a semiconductor substrate, an electron avalanche inducing layer so formed as to constitute a heterojunction with said p-semiconductor layer for inducing an electron avalanche breakdown in cooperation with said p-semiconductor layer, and a metal compound layer formed on said electron avalanche inducing layer, wherein electron emission is achieved by application of a reverse bias between said p-semiconductor layer and said electron avalanche inducing layer; and wherein a diamond layer is used as said p-semiconductor layer, an n-semiconductor layer produced by a material different from the diamond and having an energy band gap no greater than the diamond is used as said electron avalanche inducing layer, and said metal compound layer has a work function no greater than an energy bandgap width of said p-semiconductor layer.

21. An electron emitting device comprising a p-semiconductor layer formed on a semiconductor substrate, an electron avalanche inducing layer so formed as to constitute a heterojunction with said p-semiconductor layer for inducing an electron avalanche breakdown in cooperation with said p-semiconductor layer, and a metal compound layer formed on said electron avalanche inducing layer, wherein electron emission is achieved by application of a reverse bias between said p-semiconductor layer and said electron avalanche inducing layer; and wherein a diamond layer is used as said p-semiconductor layer, an n-semiconductor layer produced by a material different from the diamond and having an energy band gap no greater than the diamond is used as said electron avalanche inducing layer, and said metal compound layer has a thickness no greater than 100 Å and a work function no greater than an energy bandgap width of said p-semiconductor layer.

22. An electron emitting device comprising an n-semiconductor layer formed on a semiconductor substrate, a p-semiconductor layer so formed as to constitute a pn junction with said n-semiconductor layer, wherein electron emission from said p-semiconductor layer is achieved by application of a forward bias between said p-semiconductor layer and said n-semiconductor layer and a surface of negative electron affinity state; and wherein a diamond layer is used as said p-semiconductor layer.

23. An electron emitting device comprising an n-semiconductor layer formed on a semiconductor substrate, a p-semiconductor layer so formed as to constitute a pn junction with said n-semiconductor layer formed on said p-semiconductor layer, wherein the electron emission from said p-semiconductor layer is achieved by application of a forward bias between said p-semiconductor layer and said n-semiconductor layer and a surface of negative electron affinity state; and wherein a diamond layer is used as said p-semiconductor layer and said metal layer has a work function greater than an energy band gap width of said p-semiconductor layer.

24. An electron emitting device comprising an n-semiconductor layer formed on a semiconductor substrate, a p-semiconductor layer so formed as to constitute a pn junction with said n-semiconductor layer, a metal compound layer formed on said p-semiconductor layer, wherein electron emission from said p-semiconductor layer is achieved by application of a forward bias between said p-semiconductor layer and said n-semiconductor layer and a surface of negative electron affinity state; and wherein a diamond layer is used as said p-semiconductor layer and said metal layer has a work function greater than an energy band gap width of said p-semiconductor layer.

25. An electron emitting device comprising an n-semiconductor layer formed on a semiconductor substrate, a p-semiconductor layer so formed as to constitute a pn junction with said n-semiconductor layer, a metal layer formed on said p-semiconductor layer, wherein electron emission from said p-semiconductor layer is achieved by application of a forward bias between said p-semiconductor layer and said n-semiconductor layer and a surface of negative electron affinity state; and wherein a diamond layer is used as said p-semiconductor layer and said metal layer has a thickness no greater than 100 Å and a work function greater than an energy band gap width of said p-semiconductor layer.

26. An electron emitting device comprising an n-semiconductor layer formed on a semiconductor substrate, a p-semiconductor layer so formed as to constitute a pn junction with said n-semiconductor layer, a metal compound layer formed on said p-semiconductor layer, wherein electron emission from said p-semiconductor layer is achieved by application of a forward bias between said p-semiconductor layer and said n-semiconductor layer and a surface of negative electron affinity state; and wherein a diamond layer is used as said p-semiconductor layer and said metal compound layer has a thickness no greater than 100 Å and a work function greater than an energy band gap width of said p-semiconductor layer.

27. An electron emitting device comprising an n-semiconductor layer formed on a semiconductor substrate, a p-semiconductor layer so formed as to constitute a heterojunction with said n-semiconductor layer, wherein electron emission from said p-semiconductor layer is achieved by application of a forward bias between said p-semiconductor layer and said n-semiconductor layer and a surface of negative electron affinity state; and wherein a diamond layer is used as said p-semiconductor layer.

28. An electron emitting device comprising an n-semiconductor layer formed on a semiconductor substrate, a p-semiconductor layer so formed as to constitute a hetero pn junction with said n-semiconductor layer, a metal layer formed on said p-semiconductor layer, wherein electron emission from said p-semiconductor layer is achieved by application of a forward bias between said p-semiconductor layer and said n-semiconductor layer and a surface of negative electron affinity state; and wherein a diamond layer is used as said p-semiconductor layer, said layer produced by a material different from the diamond and having an energy band gap width no greater than the diamond, said metal layer having a work function no greater than the energy band gap width of said p-semiconductor layer.

29. An electron emitting device comprising an n-semiconductor layer formed on a semiconductor substrate, a p-semiconductor layer so formed as to constitute a hetero pn junction with said n-semiconductor layer, a metal compound layer formed on said p-semiconductor layer, wherein electron emission from said p-semiconductor layer is achieved by application of a forward bias between said p-semiconductor layer and said n-semiconductor layer and a surface of negative electron affinity state; and wherein a diamond layer is used as said p-semiconductor layer, said layer produced by a material different from the diamond and having an energy band gap width no greater than the diamond, said metal compound layer having a work function no greater than the energy band gap width of said p-semiconductor layer.

30. An electron emitting device comprising an n-semiconductor layer formed on a semiconductor substrate, a p-semiconductor layer so formed as to constitute a hetero pn junction with said n-semiconductor layer, a metal layer formed on said p-semiconductor layer, wherein electron emission from said p-semiconductor layer is achieved by application of a forward bias between said p-semiconductor layer and said n-semiconductor layer and a surface of negative electron affinity state; and wherein a diamond layer is used as said p-semiconductor layer, said layer produced by a material different from the diamond and having an energy band gap width no greater than the diamond, said metal layer having a thickness no greater than 100 Å and a work function no greater than the energy band gap width of said p-semiconductor layer.

31. An electron emitting device comprising an n-semiconductor layer formed on a semiconductor substrate, a p-semiconductor layer so formed as to constitute a hetero pn junction with said n-semiconductor layer, a metal compound layer formed on said p-semiconductor layer, wherein electron emission from said p-semiconductor layer is achieved by application of a forward bias between said p-semiconductor layer and said n-semiconductor layer and a surface of negative electron affinity state; and wherein a diamond layer is used as said p-semiconductor layer, said layer produced by a material different from the diamond and having an energy band gap width no greater than the diamond, said metal compound layer having a thickness no greater than 100 Å and a work function no greater than the energy band gap width of said p-semiconductor layer.

* * * * *

UNITED STATES PATENT AND TRADEMARK OFFICE
CERTIFICATE OF CORRECTION

PATENT NO. : 5,202,571
DATED : April 13, 1993
INVENTOR(S) : KEIJI HIRABAYASHI, ET AL.

It is certified that error appears in the above-identified patent and that said Letters Patent is hereby corrected as shown below:

COLUMN 1

Line 21, "(Shottky" should read --(Schottky--.
Line 27, "a" should read --an--.
Line 31, "an inverse" should read --a reverse--.
Line 36, "Shottky" should read --Schottky--.
Line 38, "an inverse" should read --a reverse--.
Line 46, "there" should read --it-- and "required" should read --required to supply--.
Line 60, "inverse" should read --reverse--.
Line 64, "inverse" should read --reverse--.

COLUMN 2

Line 4, "Shottky" should read --Schottky--.
Line 5, "Shottky" should read --Schottky--.
Line 20, "Shottky" should read --Schottky--.
Line 26, "a" should read --an--.
Line 44, "for," should read --for--.

COLUMN 3

Line 11, "relative" should read --relatively--.
Line 24, "Shottky" should read --Schottky--.
Line 31, "according" should read --according to--.
Line 39, "an" should read --a--.
Line 47, "a" should read --an--.
Line 49, "Shottky" should read --Schottky--.

UNITED STATES PATENT AND TRADEMARK OFFICE
CERTIFICATE OF CORRECTION

PATENT NO. : 5,202,571

DATED : April 13, 1993

INVENTOR(S) : KEIJI HIRABAYASHI, ET AL.

It is certified that error appears in the above-identified patent and that said Letters Patent is hereby corrected as shown below:

COLUMN 4

Line 3, "a" (first occurrence) should read --an--.
Line 14, "with" should be deleted.
Line 19, "forming" should read --forming a--.

COLUMN 5

Line 24, "a" should read --an--.
Line 25, "a n-semi-" should read --an n-semi- --.
Line 28, "a n-type" should read --an n-type--.
Line 34, "an inverse" should read --a reverse--.
Line 62, "in case" should read --in the case--.
Line 63, "hetero junction" should read --heterojuntion-- and "a n-semi-" should read --an n-semi- --.

COLUMN 6

Line 7, "a" (first occurrence) should read --an--.
Line 9, "the" (first occurrence) should be deleted.
Line 11, "stable" should read --more stable--.
Line 14, "inverse" should read --reverse--.
Line 29, "Shottky" should read --Schottky--.
Line 33, "an" should read --a--.
Line 35, "Shottky" should read --Schottky--.
Line 54, "he" should be deleted.

COLUMN 7

Line 26, "Shottky" should read --Schottky--.
Line 34, "indicates" should read --wherein q indicates-- and "Shottky" should read --Schottky--.

--

UNITED STATES PATENT AND TRADEMARK OFFICE

CERTIFICATE OF CORRECTION

PATENT NO. : 5,202,571

DATED : April 13, 1993

INVENTOR(S) : KEIJI HIRABAYASHI, ET AL.

It is certified that error appears in the above-identified patent and that said Letters Patent is hereby corrected as shown below:

COLUMN 7

Line 37, "Shottky" should read --Schottky--.
Line 68, "Shottky" should read --Schottky--.

COLUMN 8

Line 7, "Shottky" should read --Schottky--.
Line 28, "stabler" should read --more stable--.
Line 53, "First" should read --First,--.

COLUMN 9

Line 14, "a" should read --an--.
Line 19, "hetero" should read --hetero- --.
Line 27, "a" (first occurrence) should read --an--.

COLUMN 10

Line 21, "stabler" should read --more stable--.
Line 28, "am" should read --an--.
Line 41, "a n-diamond" should read --an n-diamond--.
Line 46, "an inverse" should read --a reverse--.

COLUMN 11

Line 9, "inverse" should read --reverse--.
Line 33, "hetero junction" should read --heterojunction--.
Line 41, "hetero junction" should read --heterojunction--.
Line 67, "ero junction" should read --erojunction-- and "layer." should read --layer 202.--.

--

UNITED STATES PATENT AND TRADEMARK OFFICE

CERTIFICATE OF CORRECTION

PATENT NO. : 5,202,571

DATED : April 13, 1993

INVENTOR(S) : KEIJI HIRABAYASHI, ET AL.

It is certified that error appears in the above-identified patent and that said Letters Patent is hereby corrected as shown below:

COLUMN 12

Line 6, "an inverse" should read --a reverse--.
Line 29, "surfacial" should read --surface--.
Line 36, "Shottky" should read --Schottky--.
Line 41, "shown are" should read --are shown--.
Line 45, "Shottky" should read --Schottky--.
Line 50, "an" should read --a--.

COLUMN 13

Line 12, "an inverse" should read --a reverse--.
Line 13, "Shottky" should read --Schottky--.
Line 16, "passes" should read --pass--.
Line 18, "form" should read --from--.
Line 20, "Shottky" should read --Schottky--.
Line 43, "an inverse" should read --a reverse--.
Line 66, "conductor" should be deleted and "an inverse" should read --a reverse--.

COLUMN 14

Line 3, "Shottky" should read --Schottky--.

COLUMN 15

Line 42, "- enter" should read --enter--.

COLUMN 16

Line 2, "a specific" should read --to obtain a specific--.
Line 64, "surfacial" should read --surface--.

UNITED STATES PATENT AND TRADEMARK OFFICE
CERTIFICATE OF CORRECTION

PATENT NO. : 5,202,571

DATED : April 13, 1993

INVENTOR(S) : KEIJI HIRABAYASHI, ET AL.

It is certified that error appears in the above-identified patent and that said Letters Patent is hereby corrected as shown below:

COLUMN 17

Line 15, "Shottky" should read --Schottky--.
Line 33, "to use" should read --use of--.
Line 54, "achieves" should read --achieved--.

COLUMN 21

Line 2, "band gap." should read --band gap width of said p-semiconductor layer.--.
Line 20, "band gap." should read --band gap width of said p-semiconductor layer.--.
Line 21, "AN" should read --An--.
Line 26, "p-semi-conductor" should read --p-semiconductor--.
Line 27, "electron" should read --the electron--.
Line 52, "bandgap" should read --band gap--.

COLUMN 22

Line 3, "bandgap" should read --band gap--.
Line 22, "bandgap" should read --band gap--.
Line 42, "bandgap" should read --band gap--.

COLUMN 23

Line 61, "electron" should read --the electron--.

UNITED STATES PATENT AND TRADEMARK OFFICE

CERTIFICATE OF CORRECTION

PATENT NO. : 5,202,571

DATED : April 13, 1993

INVENTOR(S) : KEIJI HIRABAYASHI, ET AL.

It is certified that error appears in the above-identified patent and that said Letters Patent is hereby corrected as shown below:

COLUMN 24

Line 15, "electron" should read --the electron--.
Line 32, "electron" should read --the electron--.
Line 50, "electron" should read --the electron--.

Signed and Sealed this

Twelfth Day of April, 1994

Attest:

Bruce Lehman

BRUCE LEHMAN

Attesting Officer

*Commissioner of Patents and Trademarks*

UNITED STATES PATENT AND TRADEMARK OFFICE

CERTIFICATE OF CORRECTION

PATENT NO. : 5,202,571

DATED : April 13, 1993

INVENTOR(S) : KEIJI HIRABAYASHI ET AL.

It is certified that error appears in the above-identified patent and that said Letters Patent is hereby corrected as shown below:

COLUMN 22

Line 60, after "layer," insert --a metal compound layer formed on said p-semiconductor layer,--.

Line 67, "greater" should read --no greater--.

COLUMN 23

Line 13, "greater" should read --no greater--.

Line 27, "greater" should read --no greater--.

Line 43, "greater" should read --no greater--.

COLUMN 24

Line 4, "said layer" should read --said n-semiconductor layer--.

Line 21, "said layer" should read --said n-semiconductor layer--.

Line 38, "said layer" should read --said n-semiconductor layer--.

UNITED STATES PATENT AND TRADEMARK OFFICE
CERTIFICATE OF CORRECTION

PATENT NO. : 5,202,571

DATED : April 13, 1993

INVENTOR(S) : KEIJI HIRABAYASHI ET AL.

It is certified that error appears in the above-identified patent and that said Letters Patent is hereby corrected as shown below:

<u>COLUMN 24 (CONTINUED)</u>

Line 55, "said layer" should read --said n-semiconductor layer--.

Signed and Sealed this

Seventeenth Day of February, 1998

Attest:

BRUCE LEHMAN

*Attesting Officer*

*Commissioner of Patents and Trademarks*